United States Patent [19]
Krishna et al.

[11] Patent Number: 6,000,048
[45] Date of Patent: *Dec. 7, 1999

[54] COMBINED LOGIC AND MEMORY CIRCUIT WITH BUILT-IN MEMORY TEST

[75] Inventors: Srinivas Krishna, Fremont; Bernard Sardinha, Milpitas, both of Calif.

[73] Assignee: Cirrus Logic, Inc., Fremont, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/696,551

[22] Filed: Aug. 14, 1996

[51] Int. Cl.$^6$ .................................................. G11C 29/00
[52] U.S. Cl. ............................................. 714/718; 714/42
[58] Field of Search ............................. 714/718, 42, 724, 714/25, 30, 47, 733; 365/201; 324/73.1

[56] References Cited

U.S. PATENT DOCUMENTS

| | | | |
|---|---|---|---|
| Re. 34,445 | 11/1993 | Hayes et al. | 371/21.1 |
| 4,782,486 | 11/1988 | Lipcon et al. | 371/21.1 |
| 5,006,787 | 4/1991 | Katircioglu et al. | 324/73.1 |
| 5,051,996 | 9/1991 | Bergeson et al. | 371/22.4 |
| 5,138,619 | 8/1992 | Fasang et al. | 371/21.1 |
| 5,410,547 | 4/1995 | Drain | 371/22.4 |
| 5,473,573 | 12/1995 | Rao | 365/230.01 |
| 5,535,165 | 7/1996 | Davis et al. | 365/201 |

OTHER PUBLICATIONS

Alpine VGA Family—CL–GD543X: Technical Reference Manual, 3rd ed., 1994, Cirrus Logic, Inc. Fremont, CA pp.3–i–3–35.

*Primary Examiner*—Hoa T. Nguyen
*Attorney, Agent, or Firm*—Charles S. Guenzer; Robert P. Bell; Steven A. Shaw

[57] ABSTRACT

A built-in self test (BIST) for an integrated circuit (IC) including a large logic section, a large dynamic random access memory (DRAM), and a smaller static RAM (SRAM). Additional logic circuitry is included within the IC to enable the IC to test the DRAM, that is, a built-in self test of the DRAM. The DRAM test program is stored in the SRAM by the VLSI tester, and portions of the existing logic circuitry may be used for the memory testing. The VLSI tester initiates the DRAM test and inspects the results of the test but does immediately participate in the DRAM testing. Thereby, a VLSI tester can test both the logic and DRAM portions of the IC, eliminating the need for separate memory test equipment.

8 Claims, 5 Drawing Sheets

COMBINED LOGIC AND MEMORY CIRCUIT WITH BUILT-IN MEMORY TEST

FIELD OF THE INVENTION

The present invention generally relates to the built-in self testing of memory portions of integrated circuits, which enables the use of a single testing device for testing of electronic integrated circuits incorporating both logic and memory portions. Particularly, the present invention relates to built-in testing of memory embedded in a larger integrated circuit.

BACKGROUND OF THE INVENTION

Electronic integrated circuits (ICs) are usually exhaustively tested after their manufacture to assure that they perform according to their design. Because the fabrication of integrated circuits is so complex and requires precise dimensional controls, ICs are prone to defects introduced during their manufacture, and these defects can often affect only very few of the circuit elements, which can number in the millions. In complex ICs, the defective circuit element may be exposed in only one of a large number of test patterns that electrical test equipment imposes on the IC to determine whether the IC is correctly operating. Hence, elaborate high-speed automatic test equipment (ATE) has been developed for testing ICs.

Automatic testing and the associated ATE are usually divided into two distinct types. Memory testers test memory chips which contain a large number of memory cells arranged in regular arrays and additionally contain smaller amounts of support and interface circuitry. Generally, if each memory cell is tested in turn, then there is a high probability that the testing has uncovered every defect on the memory chip. Although it is common to test for different geometrically dependent fault patterns, e.g., all ones or a zero surrounded by ones, these patterns also can be shifted through the regularly arranged memory cells. As a result, for memory testing, the test patterns are relatively simple and the number of test sequences is proportional to $N_M$, where $N_M$ is the number of memory cells.

In contrast to memory testers, logic testers test logic chips, such as microprocessors, controllers, and other related circuitry embodied in an integrated circuit. In general, complex logic has circuitry which requires several clock cycles to ingest particular sets of input data that exercise deeply embedded parts of the logic circuitry. The number of exhaustive test cycles may be much greater than $N_L$, the number of logic gates on the chip. Also, advanced logic circuitry may have several hundred input and output pins. Logic testing therefore requires well considered test vectors applied to testers with large number of input probes and output probes.

The result is that commercial ATE equipment has developed along two paths. One type of equipment includes memory testers, the other type includes VLSI (very large-scale integrated-circuit) testers for testing logic circuitry, and the use of one type of tester to test the other type of circuitry at a minimum introduces severe inefficiencies. An example of a commercial VLSI tester is the Duo from Credence, Inc. of Beaverton, Oreg.

Modern video controllers have an integrated-circuit structure that does not neatly fit the above division of integrated circuits and associated test equipment. A video controller is used, for example, in personal computers to receive video control signals from the microprocessor and to translate those signals into a continuous stream of usually analog signals to control a cathode ray tube (CRT) or other equivalent display. Video controllers have become increasingly important with the advent of graphical user interfaces and high-resolution displays, both of which place heavy demands on their video controllers. An example of a video controller integrated circuit, often called a video accelerator chip, is the CL-GD5434, available from Cirrus Logic, Inc. of Fremont, Calif. and which is described in the data book *Alpine VGA Family—CL-GD543X: Technical Reference Manual*, 3rd ed., 1994, available from Cirrus. This chip has 208 pins.

A very high-level circuit diagram of the above noted video controller and its electronic environment is shown in FIG. 1. A host computer 10, usually in the form of a motherboard including a microprocessor, is typically connected via a computer bus, such as a PCI bus 12, to a video controller board, such as a VGA board 14. It is, however, understood that the invention is not limited to VGA boards or PCI buses, which may be superseded by more advanced video boards and buses; and furthermore, the invention is not even limited to video boards or video controllers.

Although in the past the VGA board 14 was a printed circuit board including many different components, more recent video controllers have incorporated most of the functions onto a single video controller integrated circuit mounted on the board 14. In particular, large blocks of memory may be included on the same chip as the logic circuitry for the video controller, that is, memory is embedded in the logic chip. Video accelerator chip 16 is representative of such a video controller (also referred to as a VGA chip). Since so many functions have been integrated into the video accelerator chip 16, some designs place it and the relatively few other components needed for video controls on the computer motherboard of the host computer 10.

The PCI bus 12 may directly communicate with a logic section 18 of the video accelerator chip 16. The logic section 18 generally controls a video buffer 20 including a video first-in/first-out buffer section 22 and a cursor register 24, both of which input to a palette table 26 which converts the video and cursor signals to digital color signals of preselected colors on three digital color output lines 28. The palette table 26 is usually implemented as a static random-access memory (SRAM) of fairly small size, for example, principally a 256×18 section on the CL-GD543X operating as a look-up table. Although the described embodiment utilizes a 256×18 SRAM, it is anticipated that in more advanced video accelerator chips, the length of the words in the palette table will lengthen to N bits, requring a 256×N SRAM. The palette table 26 outputs, in one mode, 6 bits to each of the three digital color output lines 28 for any of 256 colors. A digital-to-analog converter 30 converts the digital color signals to three equivalent analog color signals R, G, B controlling the color display on an analog display 31, such as a cathode-ray tube (CRT). A CRT controller 34 outputs synchronization signals to the analog display 32 and also controls the cursor register 24.

The logic section 18 relies upon a large display memory 32, usually implemented in dynamic random-access memory (DRAM). In advanced video accelerator chips, the display DRAM is embedded in the chip 16. That is, the single IC video chip 16 includes both a large logic section and a large DRAM section. The DRAM 32 in present advanced video accelerator chips commonly has a size in the range of ½ to 2 megabytes. The large display memory 32 allows a relatively low flow of information on the PCI bus 12 to update a large amount of slowly changing color data in the display memory 32, thereby off loading display functions from the host computer 10. A more complete diagram of the accelerator chip 16 is provided on page 3–32 of the cited Cirrus reference manual.

A clock oscillator 34 on the video board 14 controls a frequency synthesizer 36 on the video accelerator chip 16, which produces at least two clocking signals for various components on the VGA chip. The separate timing circuitry can be used because the timing of the display 31 is fairly independent of the PCI bus 12. The video board 14 may also contain passive elements, such as for power conditioning. Similar types of video-control circuitry are generally required for non-CRT displays.

The SRAM 26 and DRAM 32 have significantly different characteristics. Static RAM is based on flip-flop circuitry that holds values in its memory as long as power to the SRAM is not removed. The SRAM 26 is relatively small and contains color-conversion information that changes only infrequently. It needs to be very fast to keep up with the video display rate, but SRAM tends to be relatively expensive and may consume substantial power. On the other hand, dynamic RAM is based on capacitive cells in a MOS circuits. These cells are inherently leaky, and their contents need to be refreshed periodically on the order of milliseconds. However, DRAM storage cells are small and simple compared to SRAM memory cells. As a result, the DRAM 32 can be made large but relatively inexpensive on a per-bit basis. Its speed is somewhat low but can be enhanced by block transfers which are characteristic of video mapping.

Manufacturers of video accelerator chips or of video boards must assure that their circuitry is operating correctly. However, the large embedded DRAM 32 of FIG. 1 presents a testing problem. A VLSI tester can fairly easily test the logic section 16 and the relatively small palette table SRAM 26 as well as other lesser circuitry. But testing the large DRAM 32 with a VLSI tester, particularly when it needs to interface through logic optimally designed for non-testing functions, becomes prohibitively long and expensive. The same constraints do not apply to testing the SRAM 26 since it is relatively small, for example, 256×18, so that a relatively few test vectors from the VLSI tester can test all the locations.

A memory tester is needed for testing the large DRAM 32. However, since the DRAM 32 is embedded in the video accelerator chip 16, additional input and output pins may be required on the packaged chip 16 to effectively access the DRAM for testing. Unfortunately, the number of pin-outs on video accelerator chips is already excessively high, and it is desired to not provide extra pin-outs for memory testing. Furthermore, using two different types of testers, a VLSI tester for the logic portion and a memory tester for the DRAM portion, requires two types of expensive equipment and lengthens the testing operation.

Accordingly, it is desired to provide a method of testing DRAM embedded on a board or in a chip by a VLSI tester.

The testing of embedded RAM is an old problem One solution involving built-in self test (BIST) is described by Fasang et al. in U.S. Pat. No. 5,138,619, issued Aug. 11, 1992 and entitled BUILT-IN SELF TEST FOR INTEGRATED CIRCUIT MEMORY. However, this approach to BIST relies on pseudo-random program generators for producing the address and data used in the testing, and provides a relatively rigid test regimen.

SUMMARY OF THE INVENTION

The invention can be summarized as an apparatus and associated method for testing a large primary memory embedded in a chip that is otherwise largely logic circuitry and needs to be tested with a logic tester. The invention is particularly applicable to such a logic chip having a smaller secondary memory. The logic section is expanded to include a microcontroller for built-in self testing (BIST) that executes BIST instructions stored by the logic tester in the secondary memory so as to test the larger primary memory.

DETAILED DESCRIPTION OF THE PREFERRED EMBODIMENTS

The descriptions herein are used for examples only illustrative of the preferred embodiment of the present invention. However, it should be noted that the methods and systems of the present invention may be applied in a similar manner in other embodiments without departing from the spirit of the invention.

Figure 1:
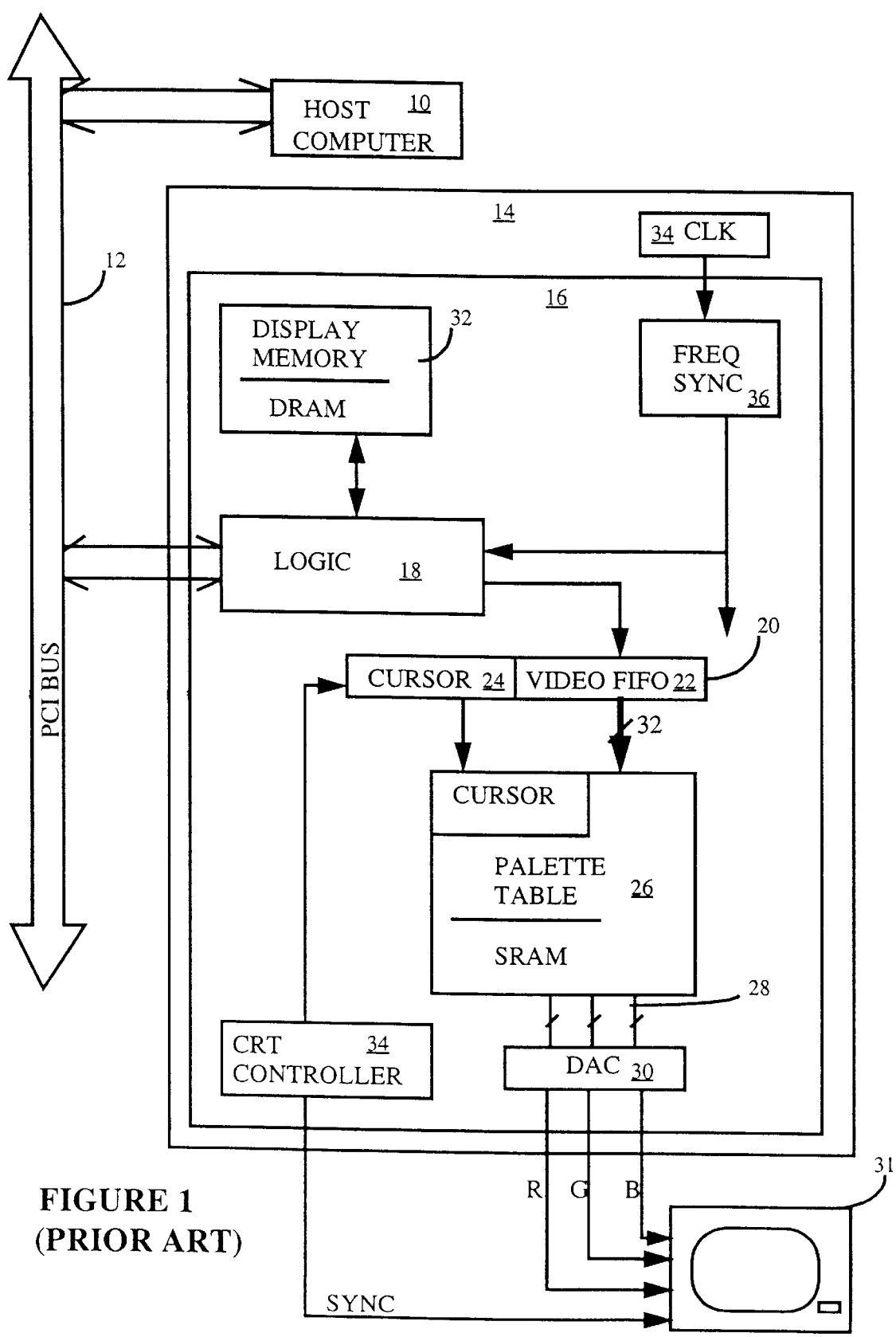
FIG. 1 is a schematical representation of a prior-art computer system including a video card.
Figure 2:
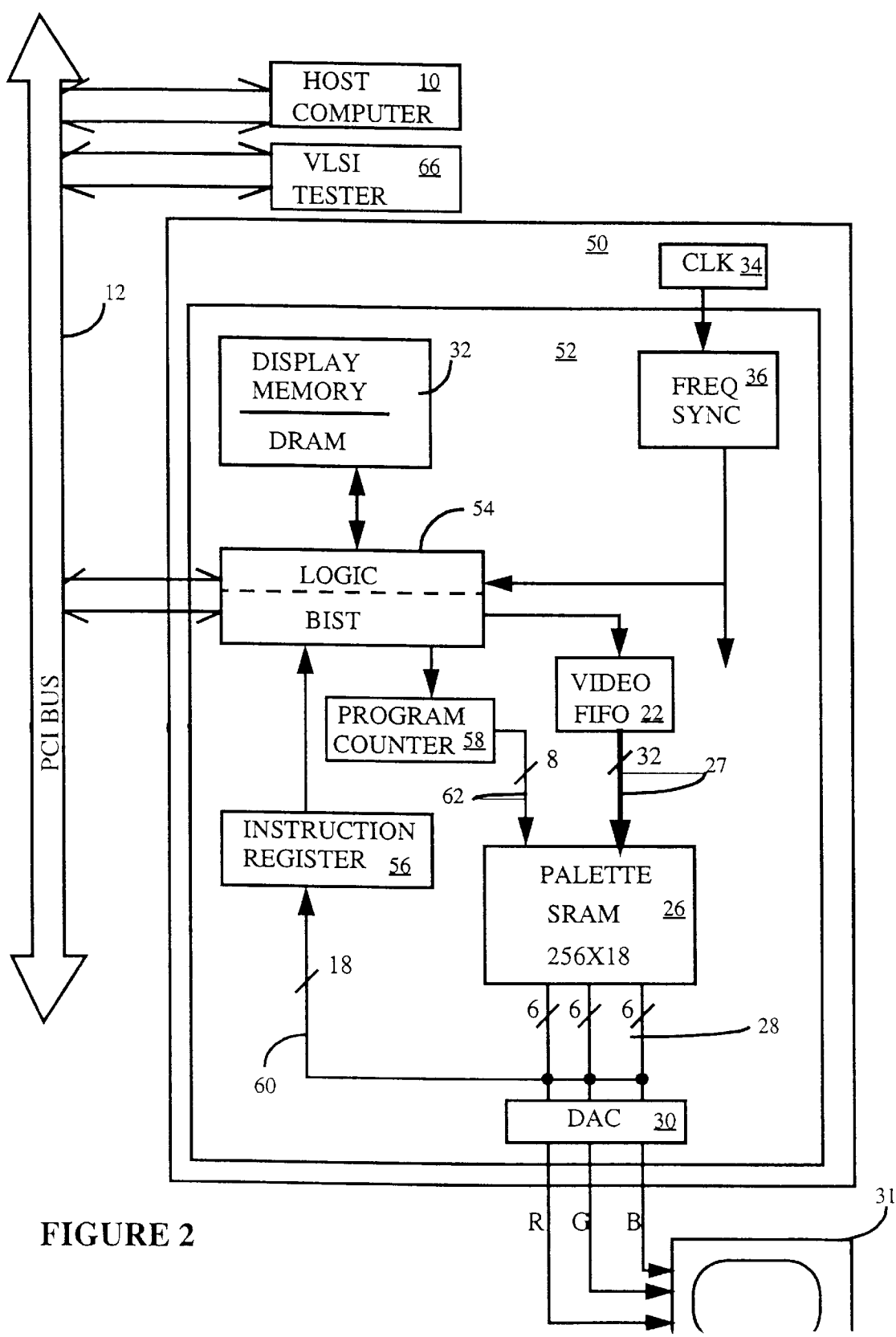
FIG. 2 is a schematic representation of a computer system of the invention including a video card with built-in self testing of the large display memory.

According to the present invention, as illustrated in the circuit diagram of FIG. 2, a video card 50 includes a video accelerator chip 52 that generally resembles the video accelerator chip 16 of the prior art but that additionally includes a built-in self test (BIST) function for the large display DRAM 32. The representation of the video accelerator chip 52 has been somewhat simplified so as to emphasize the novel features. The built-in self test is largely incorporated into a combined logic/BIST section 54 because many of the BIST functional elements are implemented by registers and the like which are otherwise used for video functions during the normal operation of the video card 50. It is to be understood that many illustrated elements could easily be viewed as being incorporated into the logic section, but they are separately illustrated because of their importance to the built-in self test.

As will be described in detail later, the BIST operations are typically executed by a microcontroller subsection which receives program instructions from an instruction register 56 and controls a program counter 58 determining the sequencing of the program instructions. The instruction register 56 and program counter 58 need not be implemented as separate circuitry but may also be incorporated into existing video registers.

The BIST program is stored in the palette SRAM 26. Since memory testing is relatively simple, the testing program need be no longer than 256 steps of 18-bit instructions, which can be accommodated within the 256×18 palette SRAM 26. The palette SRAM 26 outputs the instructions on the three digital color signal lines 28, which are combined in parallel into an 18-bit instruction input bus 60 to the instruction register 56. An 8-bit address bus 62 from the program counter 58, although illustrated separately, is tied to some of the lines of the video bus 27 between the video FIFO buffer 22 and the palette SRAM 26 so as to determine which of the 256 instructions stored therein are to be executed by the BIST microcontroller.

This arrangement requires that the BIST program be read into the palette SRAM 26, preferably from the VLSI tester 66, whenever built-in self testing is executed because in normal operation the palette SRAM 26 is being used as the color look-up table. The BIST program is read into the palette SRAM 26 by using the video set-up functions in the combined logic/BIST section 54 communicating with the SRAM 26 through the video bus 27.

The dual-frequency synthesizer 36 outputs two clock signals, one of which is used in the video modes for accessing the display DRAM 32. In the BIST mode, one of the clock signals is input to the BIST microcontroller to clock its operation. However, it is possible for the VLSI tester to supply the required clock signal to the logic/BIST section 54.

The built-in self test can be initiated and controlled in a number of ways. The video card 50 or the video accelerator chip 52 can be removed from the computer system and inserted into a VLSI tester for any testing. Alternatively, the video card 50 communicates with a VLSI tester 66 through the PCI bus 12, either with or without the host computer 10 remaining on the PCI bus 12, and the BIST circuitry is enabled on the video card 50 through the PCI bus 12. With some additional circuitry, to be described later, enough intelligence is incorporated into the BIST circuitry that the BIST testing can be initiated by a simple sequence of instructions from the host computer 10, thus eliminating the need for the VLSI tester 66.

Figure 3:
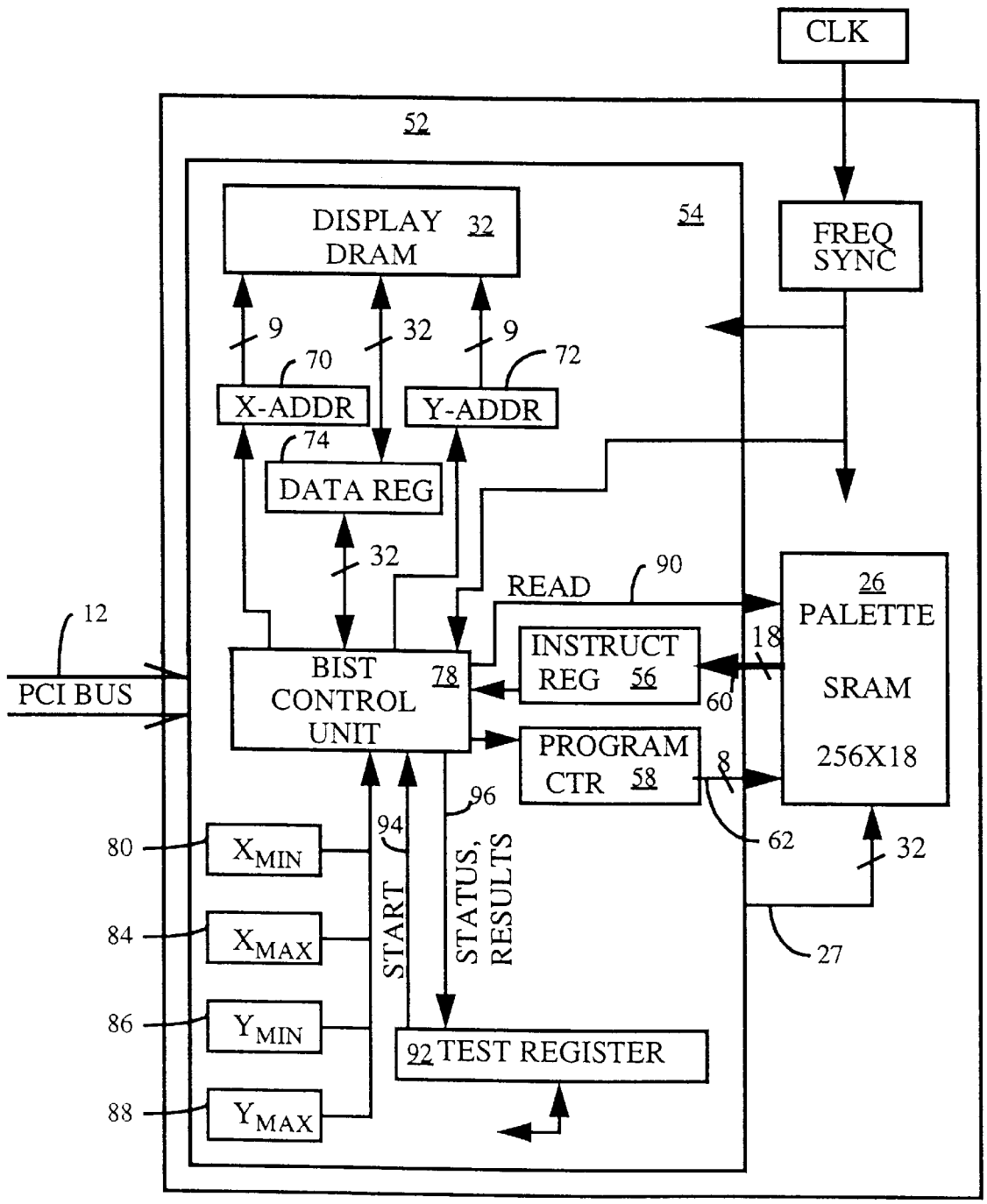
FIG. 3 is a schematic representation of many of the circuit elements involved in the built-in self test.

To provide some specificity to the examples, the display DRAM 32 will be assumed to be a 1 MB (megabyte) DRAM with words of 4 bytes (32 bits) arranged in 512 rows and 512 columns so that the rows and columns can be accessed, as illustrated in FIG. 3, by two 9-bit address registers 70, 72 located in the combined logic/BIST section 54 of the video accelerator chip 52. The address registers 70, 72 are split apart and designated as respectively providing the x-address and the y-address because DRAM is arranged in this fashion and the two addresses probe different types of circuitry. A 32-bit data register 74 exchanges data with the display DRAM 32. The address registers 70, 72 and the data register 74, as well as other functions for built-in self test (BIST), are controlled by a BIST control unit 78, which has the general architecture of a microcontroller. Four 9-bit registers 80, 82, 84, 86 connected to the BIST control unit 78 hold the minimum and maximum values of the row and column addresses. The 8-bit program counter 58 under the control of the BIST control unit 78 cycles through the 256 locations of the palette SRAM 26, now functioning as an instruction RAM. The output of the palette SRAM 26, which is enabled by a read enable line 90, is carried on the three 8-bit digital color output lines 28 (FIG. 2) connecting to the 18-bit instruction bus 60 that supplies the 18-bit instructions to the instruction register 56, which holds the instructions for execution by the BIST control unit 78. These instructions dictate the built-in self test.

An 8-bit test register 92 provides control information to the BIST control unit 78 and receives the testing status and results. The test register 92 instructs the BIST control unit 78 through a start line 94 to start the procedure for built-in self test. The BIST control unit 78 through a results bus 96 informs the test register 92 of the ongoing execution or completion of the self test and stores the results of the self test in the test register 92 for later interrogation. The format of the 8-bit test register 92 is illustrated in TABLE 1.

TABLE 1

| BIT POSITION | BIT FUNCTION |
| --- | --- |
| 1 | START |
| 2 | STATUS |
| 3 | TEST_RESULT |
| 4 | |
| 5 | |
| 6 | |
| 7 | |
| 8 | |

The first bit START can be stored with a value that instructs the BIST control unit 78 that the built-in self test should start immediately. The START bit is set by the VLSI tester to initiate immediate testing and is reset by the BIST control unit 78 when the built-in self test has been completed. The second bit STATUS is set by the BIST control unit 78 at the beginning of the self test, and is reset by the BIST control unit 78 at the end of testing. Its primary function is to lock out the PCI bus from rewriting during BIST testing any of the DRAM or SRAM memory locations or any registers in the combined logic/BIST section 54 that are relevant to BIST. In particular, it prevents a second invocation of BIST from interfering with an ongoing BIST. The third bit contains the result TEST_RESULT of the built-in self testing. In its simplest implementation, one bit describes whether no error was found or whether at least one error was found during the built-in self test. The number of bits for TEST_RESULT could be expanded to indicate the number of errors or type of error detected in the DRAM. The STATUS and TEST_RESULT bits should be read-only to the VLSI tester since only the BIST control unit 78 should change them.

Figure 4:
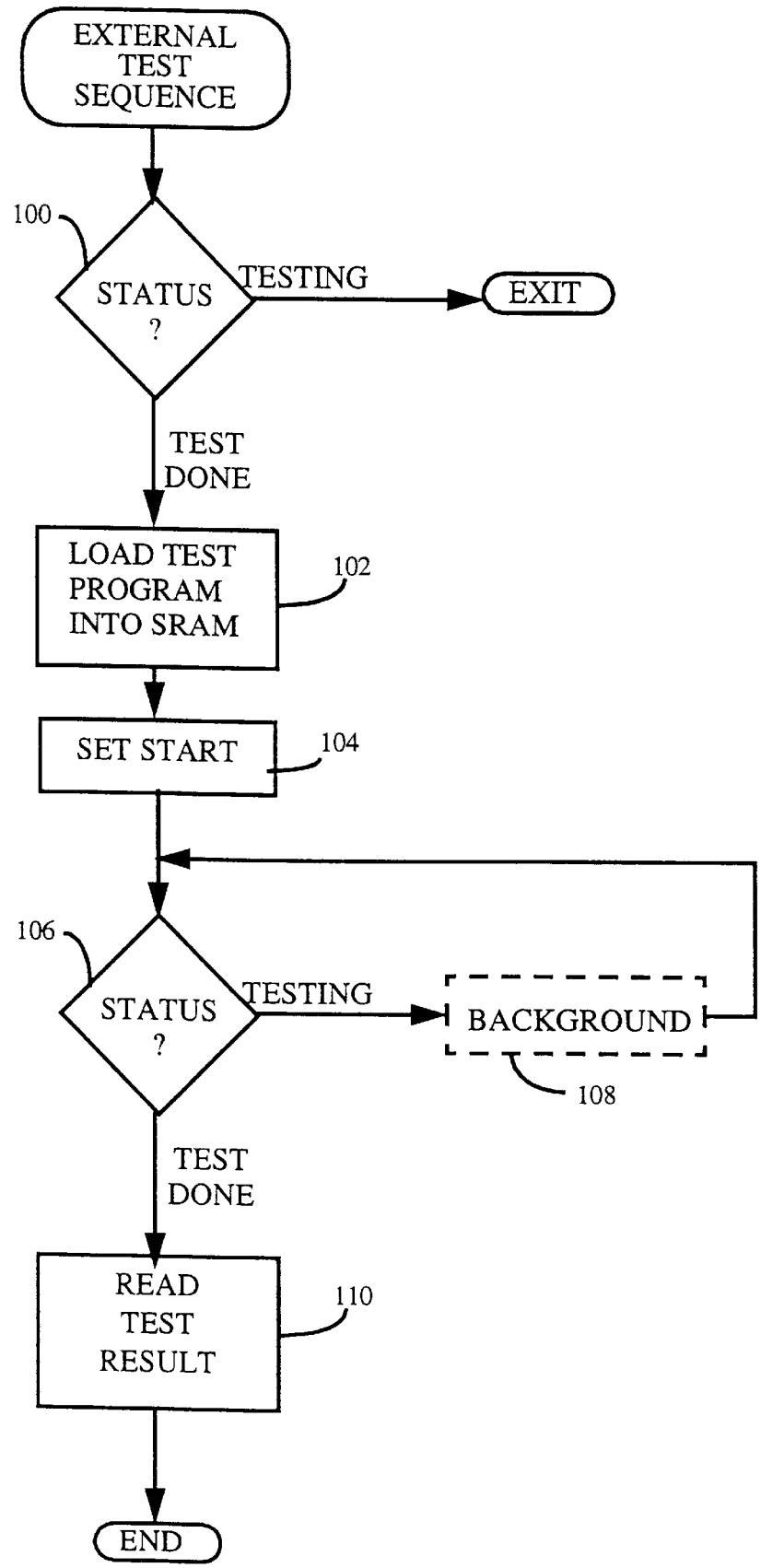
FIG. 4 is a flow diagram of the external testing sequence that invokes the built-in self testing of the invention.

An example of the test sequence which would be performed by an external test controller, such as a VLSI tester interfaced to the accelerator chip 52 through the PCI bus 12, is illustrated in the flow diagram of FIG. 4. In an initial test 100, the STATUS bit of the test register 92 is interrogated to determine if the VLSI tester should be locked out of the BIST sequence because a BIST testing sequence is underway. This initial testing assumes that the STATUS bit is reset during initialization or other appropriate exercise of the video accelerator chip 52. Otherwise, BIST could not be initiated. If the STATUS bit is set to indicate ongoing testing, the VLSI tester cannot now initiate the BIST sequence, probably because the sequence is already being performed from another invocation. If the STATUS bit is detected in step 100 to indicate that BIST testing is not ongoing, the VLSI tester in step 102 loads the 256 18-bit instructions into the SRAM 26. After the entire program has been loaded, in step 104, the VLSI tester sets the START bit in the test register 92 so as to initiate the built-in self test. Thereafter, the VLSI program queries in test 106 the STATUS bit of the test register 92. If the STATUS bit indicates that BIST testing is ongoing, the VLSI tester immediately loops around to reexecute the test 106 or performs a non-interfering background task in step 108 that will periodically reexecute the test 106. Alternatively the background task 108 could simply be a preprogrammed wait period expected to be sufficient to complete the testing. When test 106 finally determines a STATUS bit indicating that the BIST testing is done, in step 110 the VLSI tester reads the TEST_RESULT from the test register 92.

The BIST control unit 78 must set the STATUS bit at the beginning of memory testing and reset it at the completion of testing. The BIST control unit 78 must also reset the START bit to TEST_DONE at the end of its testing program to prevent immediate reexecution of the BIST procedure, which would likely occur before the results of the first execution have been read. Also, the BIST control unit 78 must block the PCI bus from performing any function within the video accelerator chip 52 that would interfere with the BIST process.

It is thus seen that once the VLSI tester sets up and initiates the internal BIST process, it is not substantially involved until the BIST is completed except for periodic polling of the test register 92. Even this involvement could be eliminated with an interrupt issued by the BIST control unit 78 to the VLSI tester or host computer at the completion of BIST testing.

Figure 5:
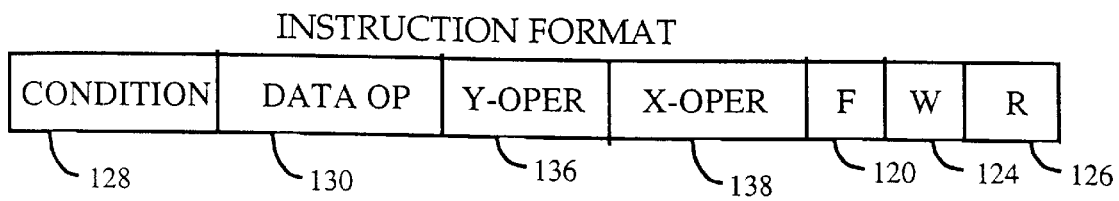
FIG. 5 is a format of the instructions stored in the small embedded memory for testing the larger embedded memory.

The 18-bit words stored in the SRAM 26 are quite sufficient for a set of instructions capable of testing a DRAM with a short program of no more than 256 instructions. An exemplary instruction format that can be accommodated with the 18 bits is illustrated in FIG. 5.

The final three fields 120, 124, 126 can be 1-bit flags indicating the type of operation with the functions given in following TABLE 2.

TABLE 2

FLAGS

| | | |
|---|---|---|
| F | Flag to Inhibit Error Checking |
| W | Write RAM |
| R | Read RAM |

The first field 128 indicates a condition dictating, for the most part, what happens to the program counter (PC) 58 at the end of the execution of the instruction. Some useful conditions are given in TABLE 3.

TABLE 3

CONDITIONS

| | |
|---|---|
| ADV | Advance PC |
| CADVX | Advance PC if condition in X address register X is satisfied |
| CADVY | Advance PC if condition in Y address register is satisfied |
| JUMPX | Load PC with contents of jump register if condition in X address register is satisfied |
| JUMPY | Load PC with contents of jump register if condition in Y address register is satisfied |
| GOTO | Unconditionally load PC with contents of jump register |
| RST | Reset PC |
| END | Return control to tester; write RESULT, reset START and STATUS bits |

The JUMPX, JUMPY, and GOTO operations require an unillustrated jump register be implemented in the BIST control unit 78 that can be loaded by the VLSI tester.

The second field 130 of the instruction format of FIG. 5 contains the data operations summarized in TABLE 4.

TABLE 4

DATA OPERATIONS

| | |
|---|---|
| LOAD_D | Load data register |
| COMP_D | Complement data register |
| SHL_D | Shift left data register |
| SHR_D | Shift right data register |
| INC_D | Increment data register |
| DEC_D | Decrement data register |
| LOAD0 | Load zero into data register |
| HOLD_D | Leave data register unchanged |

These operations load data into the 32-bit data register 74 and perform some rudimentary operations upon the loaded data.

Figure 6:
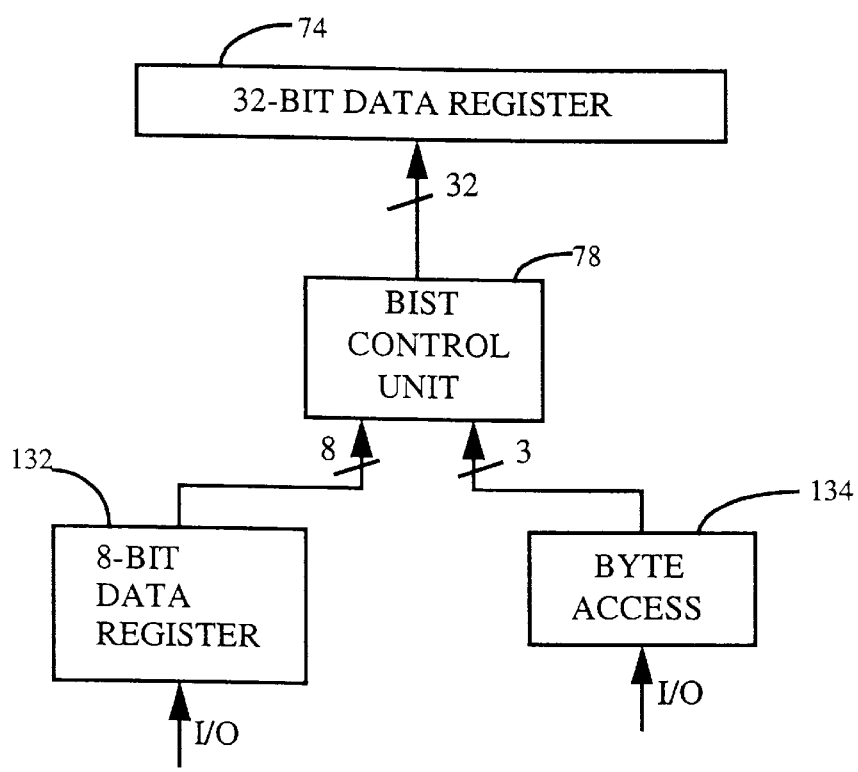
FIG. 6 is a circuit diagram of registers for loading one or more parts of the data register.

The loading of data, particularly the LOAD_D operation, is best performed with the use of two additional registers, as illustrated in the circuit schematic of FIG. 6. The VLSI tester uses I/O operations to load values into an 8-bit data register 132 and a 3-bit byte access register 134. When a LOAD_D instruction is later executed during BIST, the data DR that has been pre-loaded into the 8-bit data register 132 is transferred one or more times through the BIST control unit 78 into the 32-bit data register 74 according to the byte access values in the byte access register 134. The operation is summarized in TABLE 5.

TABLE 5

| BYTE ACCESS VALUE | | | BITS IN 32-BIT REGISTER | DATA LOADED INTO 32-BIT REGISTER |
|---|---|---|---|---|
| 0 | 0 | 0 | [7:0] | DR |
| 0 | 0 | 1 | [15:8] | DR |
| 0 | 1 | 0 | [23:15] | DR |
| 0 | 1 | 1 | [31:24] | DR |
| 1 | 0 | 0 | [15:0] | DR, DR |
| 1 | 0 | 1 | [31:16] | DR, DR |
| 1 | 1 | 0 | [23:0] | DR, DR, DR |
| 1 | 1 | 1 | [31:0] | DR, DR, DR, DR |

Thereby, the 8-bit value DR can be loaded into one, two, three, or four 8-bit sections of the 32-bit data register 74. This approach is particularly useful since memory testing usually involves fairly periodic test patterns so there is no overriding need to uniquely specify all 32 bits.

The third field 136 of the instruction of FIG. 5 is the Y-operation for affecting the Y-address register 72 and the fourth field 138 is the X-operation for affecting the Y-address register 70. Exemplary instructions are given in TABLE 6 only for the X-operations since the Y-operations can complement the X-operations and there are few differences between them.

TABLE 6

X-OPERATIONS

| | |
|---|---|
| INC_X | Increment X-address register; PC advances to next location |
| INCX_TIL_XMAX | Increment X-address register; but if X=$X_{max}$, the program counter increments and X is reset to $X_{min}$ |
| INCX@YMAX | Increment X-address register if Y=$Y_{max}$; but if X=$X_{max}$, reset X to $X_{min}$; program counter reset if condition is met |
| DECX | Decrement X-address register; PC incremented |
| DECX@YMIN | Decrement X-address register if Y=$Y_{min}$ |

TABLE 6-continued

X-OPERATIONS

| | |
|---|---|
| DECX_TIL_XMIN | Decrement X-address register until X=$X_{min}$; increment program counter only if X=$X_{min}$ |
| COMPLX | Complement X-register |

A typical set of instructions executed by the VLSI tester in loading the test program and setting the test register, as summarized in steps 102, 104 in FIG. 4, is presented in TABLE 7.

TABLE 7

VLSI TESTER INSTRUCTIONS

| | | |
|---|---|---|
| IOWR | XMIN | 0 |
| IOWR | XMAX | 511 |
| IOWR | YMIN | 0 |
| IOWR | YMAX | 511 |
| IOWR | DR | 0 |
| IOWR | BA | 7 |
| IOWR | | |
| | | Instructions to SRAM | |
| | | | |
| | | | |
| IOWR | TR | 1 |

The first four instructions write the address limits into the registers 80, 84, 86, 88. The fifth and sixth instructions write values into the 8-bit register 132 and byte access register 134 of FIG. 6. There then follow a number of instruction, up to 128 instruction, that write the BIST program into the SRAM 26 of FIGS. 2 and 3. The last step sets the START bit in the test register 92.

Although the circuit of FIG. 3 shows many registers and circuits associated with the combined logic/BIST section 54 that are used for BIST, many of them can have other functions when the video card 50 or video accelerator chip 52 is being used in its normal operation so that less additional circuitry is required for the BIST circuitry. Examples of reused circuitry are the address registers 70, 72, the data register 74, and the address limit registers 80, 82, 84, 86. It is expected, though not required, that most if not all of the control unit 74, the instruction register 56, the program counter 88, and the tester register 92 will be used exclusively for the BIST functions.

It is thus seen that with relatively little additional circuitry, the video accelerator chip 52 can be completely tested with a VLSI tester, eliminating the need both for a memory tester and for additional DRAM pin-outs. Since the BIST process, once initialized, is performed entirely on the chip, it can execute faster than possible with a memory tester operating over long probes or buses. The throughput of the VLSI tester can be increased if provision is made for the tester to test a second chip or board while the first is undergoing BIST.

A distinct advantage of the invention is the programmability of the built-in test. Unlike prior BIST circuitry that included hard-wired testing, the BIST procedure can be changed after the chip has been designed and fabricated. The VLSI tester can initiate two or more different tests on the same chip by changing the program stored in the SRAM. During the product lifetime, the testing protocol may change as some failure modes are eliminated or found to not present a problem or as additional failure modes are identified. The change in protocol can be easily accommodated by changing the BIST program instructions within the VLSI tester.

Although the invention has been described with respect to a video accelerator chip, the invention is not so limited. Other advanced integrated circuits include large portions of memory embedded in a largely logical chip and would benefit from the invention. Although the described embodiments test DRAM with a program stored in SRAM, the invention is not so limited and may be applied to various combinations of memory types, even of the same type.

Although the invention has been described with reference to a VLSI tester being used as the automatic test equipment, the BIST memory test can be initiated by other, simpler equipment. Indeed, the host computer can be programmed to provide the required instructions over the PCI bus to the board or chip under test.

While the preferred embodiment and various alternative embodiments of the invention have been disclosed and described herein, it may be apparent to those skilled in the art which various changes in form and detail may be made without departing from the spirit and scope of the invention.

What is claimed is:

1. A display controller circuit comprising:

a display memory for storing display data;

a palette memory for storing a color conversion palette and testing instructions for testing the display memory;

a logic portion, coupled to said display memory and said palette memory for receiving testing instructions stored in said palette memory and testing said display memory in response to the received instructions.

2. A combined logic and memory circuit comprising:

a first memory portion;

a second memory portion;

a logic portion, coupled to said first memory portion and said second memory portion to provide operational outputs of the combined logic and memory circuit; and a testing portion, coupled to said first memory portion and said second memory portion, incorporating parts of said logic portion, for receiving instructions stored in said second memory portion to test said first memory portion;

wherein said first memory portion, said second memory portion, said logic portion, and said testing portion are incorporated into an integrated circuit chip, and wherein said operational outputs of said logic portion includes digital outputs coupling said second memory portion to said operational outputs.

3. The combined logic and memory circuit of claim 2, wherein said operational outputs are color signals for a video controller.

4. A combined logic and memory circuit comprising:

a first memory portion;

a second memory portion;

a logic portion, coupled to said first memory portion and said second memory portion to provide operational outputs of the combined logic and memory circuit; and a testing portion, coupled to said first memory portion and said second memory portion, incorporating parts of said logic portion, for receiving instructions stored in said second memory portion for testing said first memory portion;

wherein said first memory portion, said second memory portion, said logic portion, and said testing portion are incorporated into an integrated circuit chip, and wherein said integrated circuit chip is included on a board connected to a computer bus and wherein a logic tester is connected to said computer bus.

5. A combined logic and memory circuit comprising:

a first memory portion;

a second memory portion;

a logic portion, coupled to said first memory portion and said second memory portion to provide operational outputs of said combined logic and memory circuit; and a testing portion, coupled to said first memory portion and said second memory portion, incorporating parts of said logic portion, for receiving instructions stored in said second memory portion to test said first memory portion;

wherein said first memory portion, said second memory portion, said logic portion, and said testing portion are incorporated into an integrated circuit chip, and wherein said first memory portion comprises dynamic random-access memory and said second memory portion comprises static random-access memory.

6. A method of testing an electronic module including a logic portion, a first memory, and a second memory, said method comprising the steps of:

actively testing at least first portions of said logic portion with an automatic test equipment;

loading a memory test program into said second memory from said automatic test equipment;

controlling an operation of said loaded memory test program by at least second portions of said logic portion so as to test said first memory; and examining a result of said testing of said first memory through said automatic test equipment.

7. The method of claim 6, wherein said automatic test equipment initiates said operation of said memory test program and then relinquishes control to said second portions of said logic portion.

8. The method of claim 6, wherein said first memory comprises dynamic random-access memory and said second memory comprises static random-access memory.

* * * * *